US009165091B2

(12) United States Patent
Morinaga et al.

(10) Patent No.: US 9,165,091 B2
(45) Date of Patent: Oct. 20, 2015

(54) RECIPE MANAGEMENT APPARATUS AND RECIPE MANAGEMENT METHOD

(71) Applicant: KABUSHIKI KAISHA TOSHIBA, Tokyo (JP)

(72) Inventors: Hiroyuki Morinaga, Mie (JP); Kenichi Tsujisawa, Mie (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 421 days.

(21) Appl. No.: 13/799,008

(22) Filed: Mar. 13, 2013

(65) Prior Publication Data
US 2014/0058551 A1 Feb. 27, 2014

(30) Foreign Application Priority Data

Aug. 23, 2012 (JP) ................................. 2012-184485

(51) Int. Cl.
| | |
|---|---|
| G05B 13/02 | (2006.01) |
| G06F 19/00 | (2011.01) |
| G06F 9/455 | (2006.01) |
| G06F 17/50 | (2006.01) |
| G05B 19/418 | (2006.01) |
| G06Q 10/06 | (2012.01) |

(52) U.S. Cl.
CPC .......... *G06F 17/50* (2013.01); *G05B 19/41865* (2013.01); *G06Q 10/0633* (2013.01)

(58) Field of Classification Search
CPC ............... G06F 17/50; G06Q 10/0633; G05B 19/41865
USPC ........ 700/121, 30, 97, 109, 125; 716/54, 106, 716/118, 119, 132
See application file for complete search history.

(56) References Cited

U.S. PATENT DOCUMENTS

| | | | | |
|---|---|---|---|---|
| 3,751,647 A | * | 8/1973 | Maeder et al. ................ | 713/401 |
| 3,922,704 A | * | 11/1975 | Huber et al. .................. | 257/394 |
| 5,291,397 A | * | 3/1994 | Powell ............................ | 700/97 |
| 6,077,386 A | * | 6/2000 | Smith et al. ............. | 156/345.24 |
| 6,165,805 A | * | 12/2000 | Steffan et al. ................... | 438/14 |

(Continued)

FOREIGN PATENT DOCUMENTS

| | | |
|---|---|---|
| JP | 11-288861 A | 10/1999 |
| JP | 11-345751 A | 12/1999 |
| JP | 2010-129603 A | 6/2010 |

OTHER PUBLICATIONS

Morinaga et al., "Development of Automatic Recipe Creation System for Exposure Tools", IEEE, 2007, pp. 1-4.*

Primary Examiner — Robert Fennema
Assistant Examiner — Thomas Stevens
(74) Attorney, Agent, or Firm — Posz Law Group, PLC

(57) ABSTRACT

According to one embodiment, a recipe management apparatus for comparing recipes prescribing process conditions of processing apparatuses between a plurality of the processing apparatuses having the same type. The recipe management apparatus includes a recipe reading unit, a mask unit, and a determination unit. The recipe reading unit is configured to read binary-format recipes of the plurality of processing apparatuses. The mask unit is configured to apply masks to data of the recipes based on mask position information prescribing positions which are applied with the masks in binary-format data of the recipes. The determination unit is configured to compare the plurality of recipes applied with the masks, and configured to determine whether there is a difference.

18 Claims, 7 Drawing Sheets

(56) References Cited

U.S. PATENT DOCUMENTS

| | | | |
|---|---|---|---|
| 6,178,360 B1* | 1/2001 | Pierrat et al. | 700/121 |
| 6,415,193 B1* | 7/2002 | Betawar et al. | 700/97 |
| 6,416,907 B1* | 7/2002 | Winder et al. | 430/5 |
| 6,430,572 B1* | 8/2002 | Steffan et al. | 1/1 |
| 6,493,857 B1* | 12/2002 | Nakagawa et al. | 716/107 |
| 6,507,944 B1* | 1/2003 | Kikuchi et al. | 716/55 |
| 7,062,342 B1* | 6/2006 | Feng et al. | 700/97 |
| 7,519,943 B2* | 4/2009 | Futatsuya | 716/54 |
| 7,526,408 B2* | 4/2009 | Mitsui | 702/182 |
| 7,623,942 B2* | 11/2009 | Touchstone | 700/182 |
| 7,735,055 B2* | 6/2010 | Tsutsui et al. | 716/50 |
| 7,865,866 B2* | 1/2011 | Kim et al. | 716/50 |
| 8,245,159 B2* | 8/2012 | Liu et al. | 716/50 |
| 8,966,410 B2* | 2/2015 | Huang et al. | 716/54 |
| 2002/0054703 A1* | 5/2002 | Hiroi et al. | 382/149 |
| 2002/0055804 A1* | 5/2002 | Betawar et al. | 700/117 |
| 2003/0139833 A1* | 7/2003 | Pierrat et al. | 700/97 |
| 2003/0216827 A1* | 11/2003 | Mouli | 700/97 |
| 2005/0095509 A1* | 5/2005 | Zhang et al. | 430/5 |
| 2005/0107904 A1* | 5/2005 | Mikata | 700/121 |
| 2005/0256669 A1* | 11/2005 | Mitsui | 702/123 |
| 2005/0280159 A1* | 12/2005 | Okumura | 257/774 |
| 2006/0020362 A1* | 1/2006 | Morinaga et al. | 700/121 |
| 2006/0190915 A1* | 8/2006 | Smith et al. | 716/19 |
| 2006/0247977 A1* | 11/2006 | Chen et al. | 705/26 |
| 2006/0258024 A1* | 11/2006 | Brodsky et al. | 438/14 |
| 2007/0210252 A1* | 9/2007 | Miyamoto et al. | 250/310 |
| 2008/0291467 A1* | 11/2008 | Li et al. | 356/521 |
| 2010/0112812 A1* | 5/2010 | Arisawa et al. | 438/669 |
| 2010/0138019 A1* | 6/2010 | Nagase et al. | 700/97 |
| 2010/0161093 A1* | 6/2010 | Wong et al. | 700/97 |
| 2013/0234019 A1* | 9/2013 | Miyamoto et al. | 250/306 |
| 2013/0253681 A1* | 9/2013 | Hsieh et al. | 700/97 |
| 2013/0326439 A1* | 12/2013 | Matsuoka et al. | 716/55 |

* cited by examiner

FIG.6A
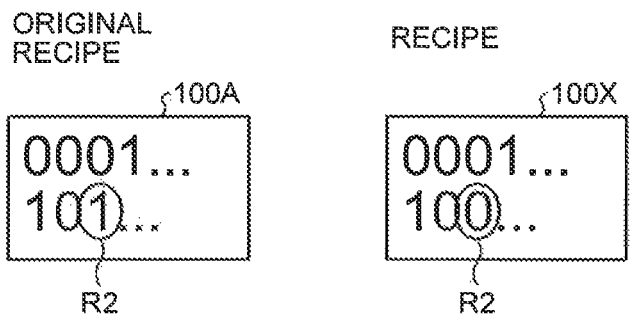
FIG.6B
| MASK POSITION | REMARK |
|---|---|
| R2 | PARAMETER ○○ MODIFIED ACCORDING TO APPARATUS CHARACTERISTICS |
| ⋮ | ⋮ |
FIG.6C
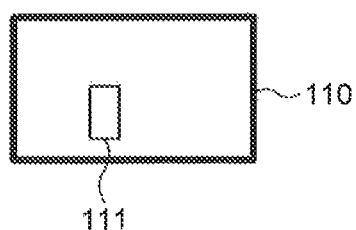

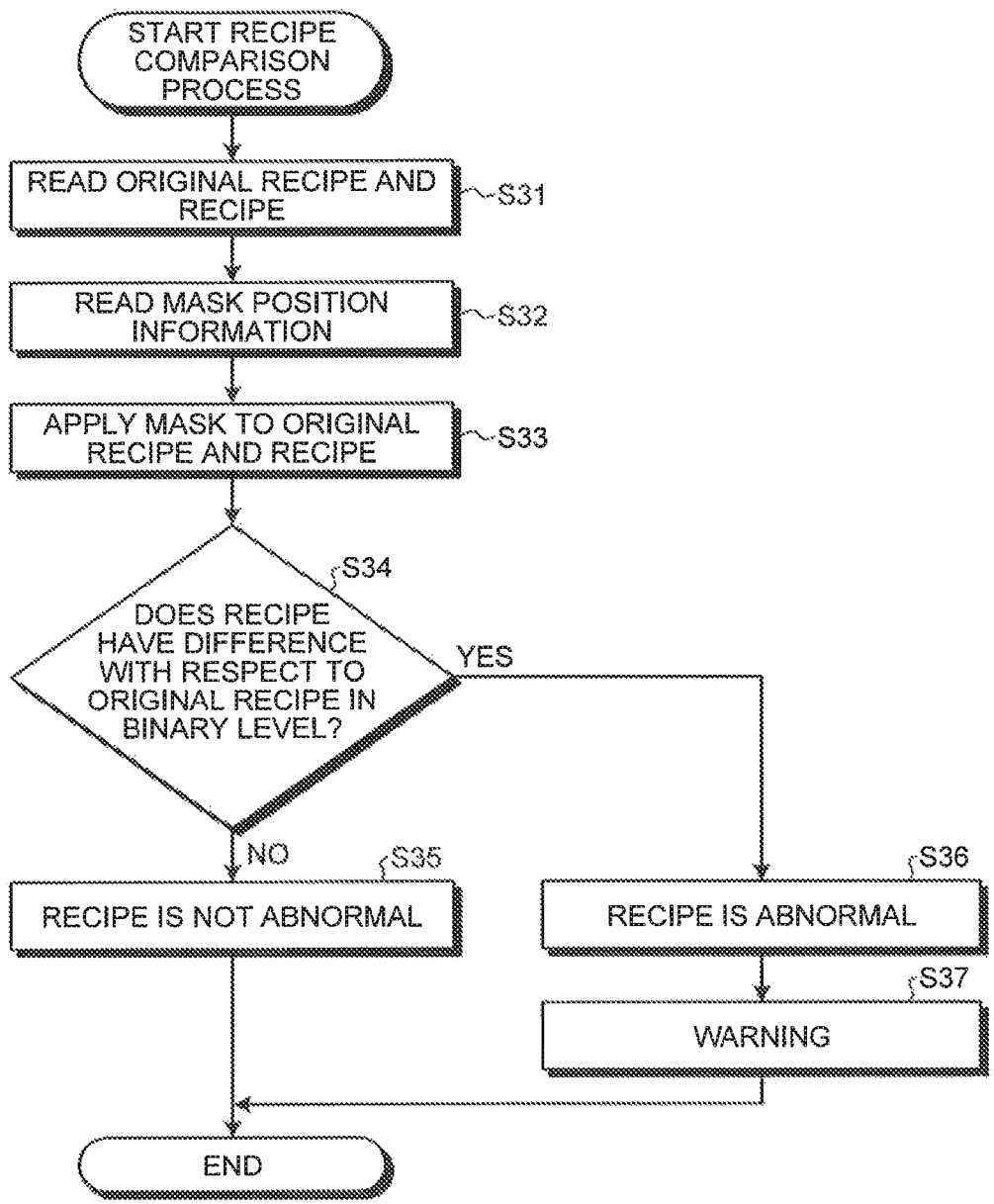

RECIPE MANAGEMENT APPARATUS AND RECIPE MANAGEMENT METHOD

CROSS-REFERENCE TO RELATED APPLICATIONS

This application is based upon and claims the benefit of priority from Japanese Patent Application No, 2012-184485, filed on Aug. 23, 2012; the entire contents of which are incorporated herein by reference.

FIELD

Embodiments described herein relate generally to a recipe management apparatus and a recipe management method.

BACKGROUND

In a semiconductor manufacturing system, a semiconductor device manufactured through a combination of a plurality of process steps is processed sequentially by processing apparatuses which are prepared for respective process steps. In general, the processing apparatuses which are installed for the respective process steps are controlled according to a recipe prescribing process conditions. In general, a plurality of processing apparatuses having the same type are used for one process step.

With respect to a plurality of processing apparatuses used in one process step, for example, although a recipe produced by copying and editing a recipe used for one processing apparatus is used for different processing apparatuses, there is a case where comparison of a plurality of the recipes is performed. In general, with respect to comparison of two recipes, the two comparison recipes are converted into data in a format which can be understood by an operator, and a difference between the two recipes is extracted. In such a comparison method, a conversion module is needed to convert a binary-data recipe into a text-data recipe. However, since the format of a recipe is defined according to each type of a processing apparatus, the conversion module needs to be produced according to each type of the processing apparatus (recipe). Therefore, in the case where a new-type processing apparatus is introduced, a new conversion module needs to be produced, so that there is a problem in that a long time is taken.

BRIEF DESCRIPTION OF THE DRAWINGS

FIGS. 6A to 6C are schematic diagrams illustrating aspects of registration of mask position information.

FIG. 7 is a flowchart illustrating an example of a procedure of a recipe comparison process according to an embodiment.

DETAILED DESCRIPTION

In general, according to one embodiment, provided is a recipe management apparatus which compares recipes prescribing process conditions of a plurality of processing apparatuses having the same type among the processing apparatuses. The recipe management apparatus is configured to include a recipe reading unit, a mask unit, and a determination unit. The recipe reading unit is configured to read binary-format recipes of the plurality of processing apparatuses. The mask unit is configured to apply masks to data of the recipe based on mask position information prescribing mask positions applied with the masks in the binary-format data of the recipes. The determination unit is configured to compare the recipes applied with the masks, and configured to determine whether there is a difference the recipes.

Hereinafter, a recipe management apparatus and a recipe management method according to embodiments will be described in detail with reference to the attached drawings. In addition, the present invention is not limited to the embodiments. In addition, hereinafter, after summary and problems of a recipe management apparatus of the related art are described, the recipe management apparatus and method according to the embodiments will be described.

Processing apparatuses such as a film preparation apparatus, an exposure apparatus, and an etching apparatus which are used in each process step for manufacturing a semiconductor device are arranged in a semiconductor manufacturing system. With respect to the processing apparatus used in each process step, only one apparatus is not arranged for one process step, but in general, a plurality of apparatuses may be arranged for one process step. In other words, in general, in one process step, the process is performed by a plurality of processing apparatuses having the same type. The processing apparatus includes a recipe in which an operation process procedure is written, so that the processing apparatus is controlled according to the recipe.

Figure 1:
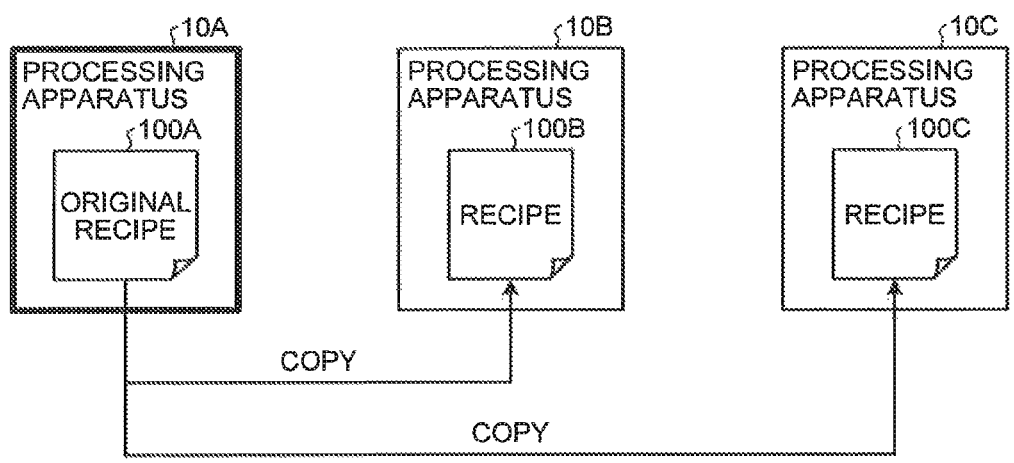
FIG. 1 is a schematic diagram illustrating a relation between recipes of a plurality of processing apparatuses in one process step.

FIG. 1 is a schematic diagram illustrating a relation between recipes of a plurality of processing apparatuses in one process step. As illustrated in the figure, an original recipe 100A prescribing a condition where a processing quality of a semiconductor device processed by one processing apparatus 10A is allowable is set in the processing apparatus 10A. For example, the original recipe 100A prescribes an optimization condition where the processing quality is allowable when the processing apparatus 10A performs the process. The original recipe 100A is binary-format data. The original recipe 100A separately prescribes what is denoted by each position of the binary-format data and which state is indicated by a numeral (0 or 1) which is set to correspond to the position. The original recipe is generally prescribed by a manufacturer of the apparatus, and thus, a user of the apparatus cannot know details of the prescription. In addition, the format of a recipe is defined according to a type of the processing apparatus. In addition, hereinafter, the processing apparatus 10A to which the original recipe 100A is set is referred to as a reference processing apparatus particularly in order to distinguish from the processing apparatus 10A from processing apparatuses 10B and 100 as other examples of the processing apparatuses.

As described above, in one process step, for example, a plurality of processing apparatuses 10A to 10C are used. Therefore, although the same recipes 100B and 100C are set for the processing apparatuses 10B and 10C other than the reference processing apparatus 10A, a copy of the original recipe 100A of the reference processing apparatus 10A is generally set as recipes 100B and 100C of the processing apparatuses 10B and 10C.

As examples where the original recipe 100A is converted into a recipe for a plurality of the processing apparatuses 10B and 10C used in one process step, there are two cases of (1) a case of modifying a parameter in accordance with apparatus characteristics and (2) a case of modifying a parameter through experiment.

(1) Case of Modifying a Parameter in Accordance with Apparatus Characteristics

Even the same type of processing apparatuses may have a slight difference in apparatus characteristics. Therefore, in the case where the original recipe 100A is directly used as recipes 100B and 100C of processing apparatuses 10B and 10C, a processing quality of a semiconductor device processed by the processing apparatuses 10B and 10C may not be allowable, or may be allowable but not an optimized process condition. In this case, parameters of the recipes 100B and 100C copied from the original recipe 100A are modified according to characteristics of the processing apparatuses 10B and 10C by using an apparatus called a recipe editor, and the modified recipes are set to the processing apparatuses 10E and 10C. In this manner, the recipe modified according to the characteristics of each processing apparatus is set to each processing apparatus, and each processing apparatus performs each process according to the recipe. In addition, herein, although the copying dates of the recipes 100B and 100C are used, updating dates of the recipes 100B and 1000 may be used.

(2) Case of Modifying a Parameter Through Experiment

Experiment may also be performed by processing apparatuses 10B and 10C other than the reference processing apparatus 10A. Even in this case, parameters of the recipes 100B and 100C are modified by using the recipe editor, and the experiment is performed by using the modified recipes. The experiment is temporarily performed, and after the experiment is ended, the modified parameters of the recipe are allowed to be returned to original parameters.

However, in the case (2), the returning of the parameters modified by the user to the original parameters after the end of the experiment may be forgotten. In this case, for example, the recipe management apparatus compares the recipes 100B and 100C of other processing apparatuses 10B and 10C with the original recipe 100A to determine whether a parameter different from the parameters of the original recipe 100A is set to the recipes 100B and 100C and notifies a warning to a user of the apparatus.

Figure 2A:
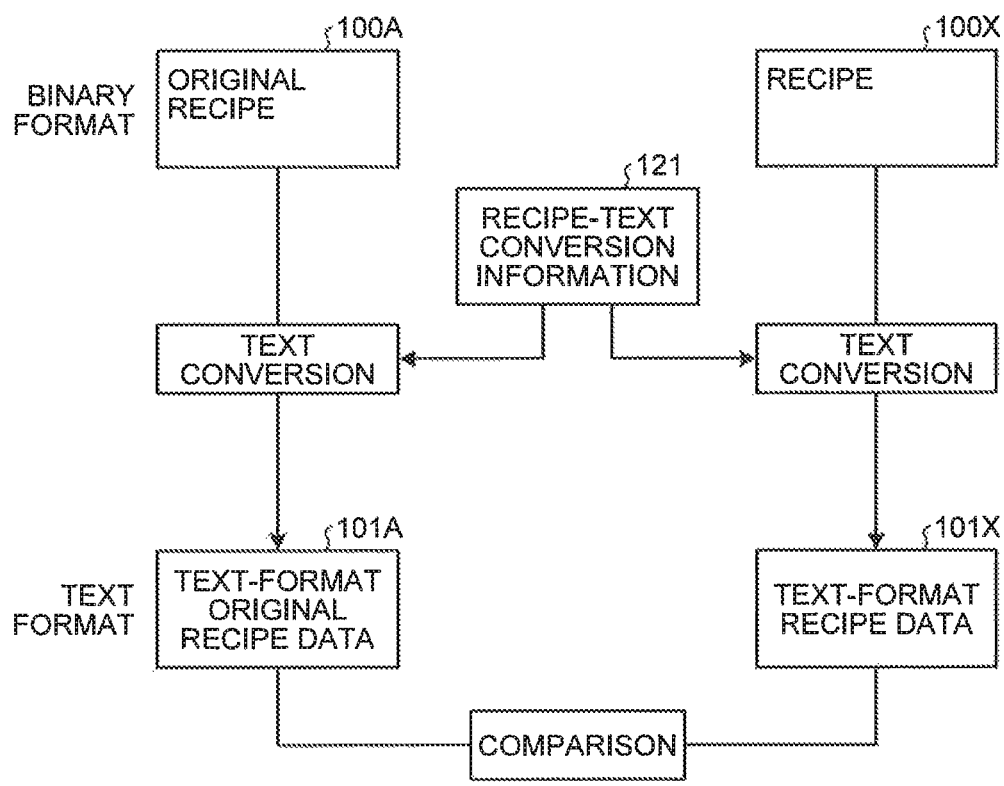
FIGS. 2A and 2B are schematic diagrams illustrating aspects of recipe comparison in a general recipe management apparatus.
Figure 2B:
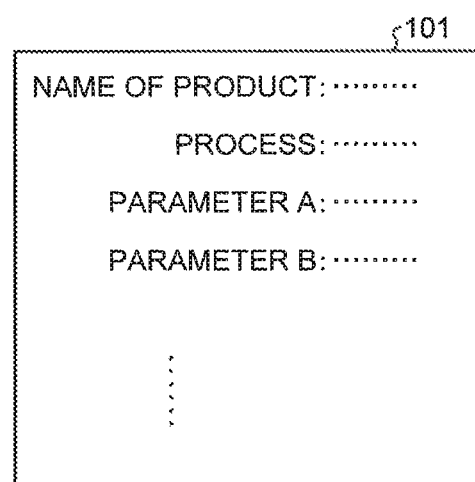

FIGS. 2A and 2B are schematic diagrams illustrating aspects of recipe comparison in a general recipe management apparatus. FIG. 2A schematically illustrates aspects of recipe comparison, and FIG. 2B illustrates an example of details of a text-converted recipe. Herein, the original recipe 100A and the comparison recipe 100X are configured to be written in the same format. As illustrated in FIG. 2A, the recipe management apparatus performs text conversion of the original recipe 100A and the recipe 100X (hereinafter, referred to as a recipe in the case where there is no need to distinguish the two recipes) written in a binary format to acquire a text-format original recipe data 101A and a text-format recipe data 101X. The text conversion is performed based on recipe text conversion information 121 prescribing which is denoted by each position in the recipes 100A and 100X and which state is represented by the value (0 or 1) thereof. Herein, since the format of the recipes 100A and 100X is different according to a type of the processing apparatus, the recipe text conversion information 121 is different according to the type of the processing apparatus.

As illustrated in FIG. 2B, the text-format recipe data 101 include items, for example, such as a name of product, a process step, and a parameter in a process step, and setting values such as a name or a value set to each item. The items and the setting values are written in language which can be recognized by a user.

Next, the recipe management apparatus compares the text-format recipe data 101X with the text-format original recipe data 101A to extract different portions and notifies the different portions to a user of the apparatus.

In this manner, in a general recipe management apparatus, since the binary-format recipe 100X is converted into the text-format recipe data 101X and the text-format recipe data 101X is compared with the text-format original recipe data 101A, a relatively long time is taken to perform the process. Therefore, in the embodiment, provided is a recipe management apparatus capable of reducing a process time required for comparison of the recipe 100X and the original recipe 100A in comparison with the related case.

Figure 3:
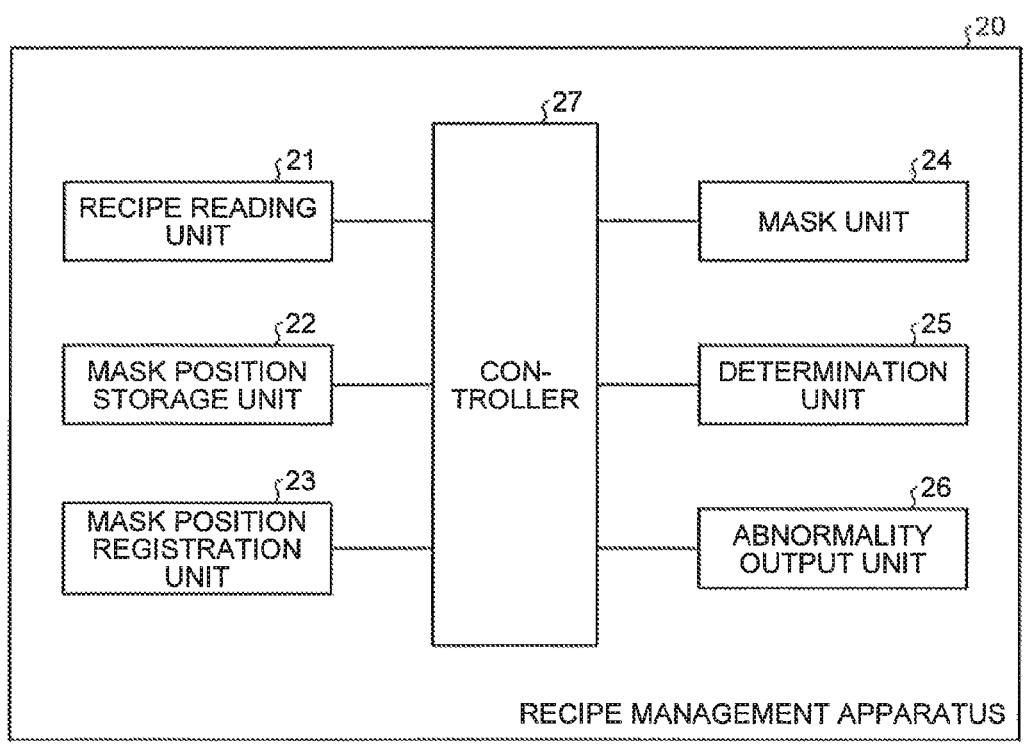
FIG. 3 is a schematic block diagram illustrating an example of a configuration of a recipe management apparatus according to an embodiment.

FIG. 3 is a schematic block diagram illustrating an example of a configuration of a recipe management apparatus according to the embodiment. The recipe management apparatus 20 is configured to include a recipe reading unit 21, a mask position storage unit 22, a mask position registration unit 23, a mask unit 24, a determination unit 25, an abnormality output unit 26, and a controller 27 which controls these processing units.

The recipe reading unit 21 reads binary-format recipes set by processing apparatuses. The recipe reading unit 21 reads recipes from the processing apparatuses through a portable information storage medium such as a USB (Universal Serial Bus) memory or a network.

The mask position storage unit 22 stores mask position information including a mask position of the binary data, which is a non-compared position (area excluding comparison targets), when two recipes are compared. The mask position is a position of the binary data applied with a mask and designated as a position counted from, for example, lead data. The mask position information may include remark with respect to the mask position in addition to the mask position. Details of the mask position information will be described below.

The mask position registration unit 23 performs a process of registering contents of the mask position information of the mask position storage unit 22. More specifically, in the case where there is a difference as a result of the comparison of the original recipe with the comparison recipe, a message of existence of a difference is displayed on, for example, a display unit (not illustrated) of the recipe management apparatus 20, and a result of user's determination whether the difference between the two recipes is allowed to be ignored is acquired. Next, in the case where the difference between the two recipes is allowed to be ignored, the position in the recipes where there is a difference is registered as a mask position in the mask position information of the mask position storage unit 22. In addition, in this case, when a remark is input by the user, the remark is also registered in correspondence with the registered mask position.

The mask unit 24 performs masking with respect to the original recipe and the comparison recipe which are read by the recipe reading unit 21 based on the mask position information of the mask position storage unit 22.

The determination unit 25 compares the binary-format original recipe and the recipe which are applied with masks to determine whether there is a difference between the two recipes. In the case where there is no difference between the two recipes, it is determined that there is no abnormality in the comparison recipe. In addition, in the case where there is a difference between the two recipes, it is determined that there is abnormality in the comparison recipe.

In the case where it is determined by the determination unit 25 that there is abnormality, the abnormality output unit 26 outputs warning information indicating that the comparison recipe is abnormal to the user. The warning information is, for example, displayed on the display unit of the recipe management apparatus 20.

Herein, details of the mask position information will be descried. As illustrated in FIG. 1, the recipes 100B and 100C are copies of the original recipe 100A, and parameters in the recipes 100B and 100C are modified (1) in accordance with the apparatus characteristics or (2) by experiment. The modification can be performed by the recipe editor described above.

In the case (1) of modifying a parameter in accordance with apparatus characteristics, even if modified recipes 100B and 100C are different from the original recipe 100A, there is no problem. Therefore, in the case where such a difference is detected through the comparison, it is preferable that the difference is not allowed to be detected as an error. In addition, although a parameter is not modified, for example, when the original recipe 100A is copied as illustrated in FIG. 1, in the case where the copy date is stored in the file, the copied recipes 100B and 100C become different from the original recipe 100A in terms of the copy date. Even in this case, since there is no substantial difference, it is preferable that the difference is not allowed to be detected as an error.

Figure 4:
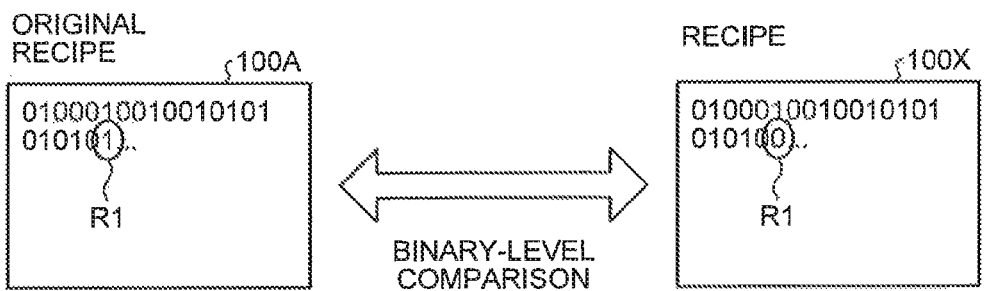
FIG. 4 is a schematic diagram illustrating aspects of binary-level comparison of an original recipe and a comparison recipe.

Therefore, in the embodiment, in the case where the recipes 100B and 100C produced by copying and editing the original recipe 100A have a difference with respect to the original recipe 100A and the difference is allowable, a different position with respect to the original recipe 100A is acquired in a binary level, and the position is extracted as a mask position. Next, the mask position is stored in mask position information of the mask position storage unit 22. FIG. 4 is a schematic diagram illustrating aspects of binary-level comparison of an original recipe and a comparison recipe. In addition, in the comparison, the to-be-compared original recipe 100A and recipe 100X are set to have the same format. For example, in this case, if the recipe 100X has a difference at a position R1 (22nd position counted from a front end of the binary data) with respect to the original recipe 100A and the difference is allowable with respect to the original recipe 100A, the position R1 is stored as a mask position in the mask position information of the mask position storage unit 22.

In this manner, since the mask position is registered in the mask position storage unit 22, during the comparison of the original recipe 100A and the comparison recipe 100X, even if a difference which is allowable with respect to the two recipes exists at the mask position, the difference is masked to be excluded from the comparison target data, so that the difference is not detected.

On the other hand, in the case (2) where the parameter is modified through experiment, when a general process is performed, a process of returning the modified parameter to an original parameter is needed. However, the returning of the modified parameter to the original parameter may be forgotten by the user. For example, in the case where a process condition corresponding to a position R1 of the recipe 100X illustrated in FIG. 4 is modified through experiment and a general process is performed, the value thereof needs to be returned to the original value, but the returning is forgotten, so that the recipe 100X may be still in the state where the experiment is performed. In this case, it is preferable that a difference of the recipes 100B and 100C with respect to the original recipe 100A can be detected as an error.

Therefore, in the embodiment, a parameter rewritten through an experiment is not allowed to be registered in mask position information. Accordingly, the recipe of which a difference is not allowable with respect to the original recipe 100A can be detected from the binary data.

Herein, a difference which is allowable in the specification will be described. In the case where, although a parameter of a recipe is modified, a processing quality of a processing apparatus is not beyond a predetermined range, it may be defined that the difference of the recipe is allowable with respect to the original recipe 100A. For example, as described above, in the case where a parameter is optimized (modified) in accordance with characteristics of a processing apparatus, it may be defined that the difference is allowable with respect to the original recipe 100A. As a result, when a wafer is processed by the processing apparatus, in the case where the processing quality satisfies a predetermined condition, a mask may be applied to a position of the recipe which corresponds to the process. In addition, similarly to the case where a parameter (recipe storing date or the like) which does not affect a process of a processing apparatus is modified, data of the position which is specified as data where a process is not needed may be applied with a mask by the user. In addition, a mask position may be set to an arbitrary position by the user.

Next, with respect to a binary-level recipe comparison method according to the embodiment, a mask position information registration process and a recipe comparison process will be sequentially described.

<Mask Position Registration Process>

Figure 5:
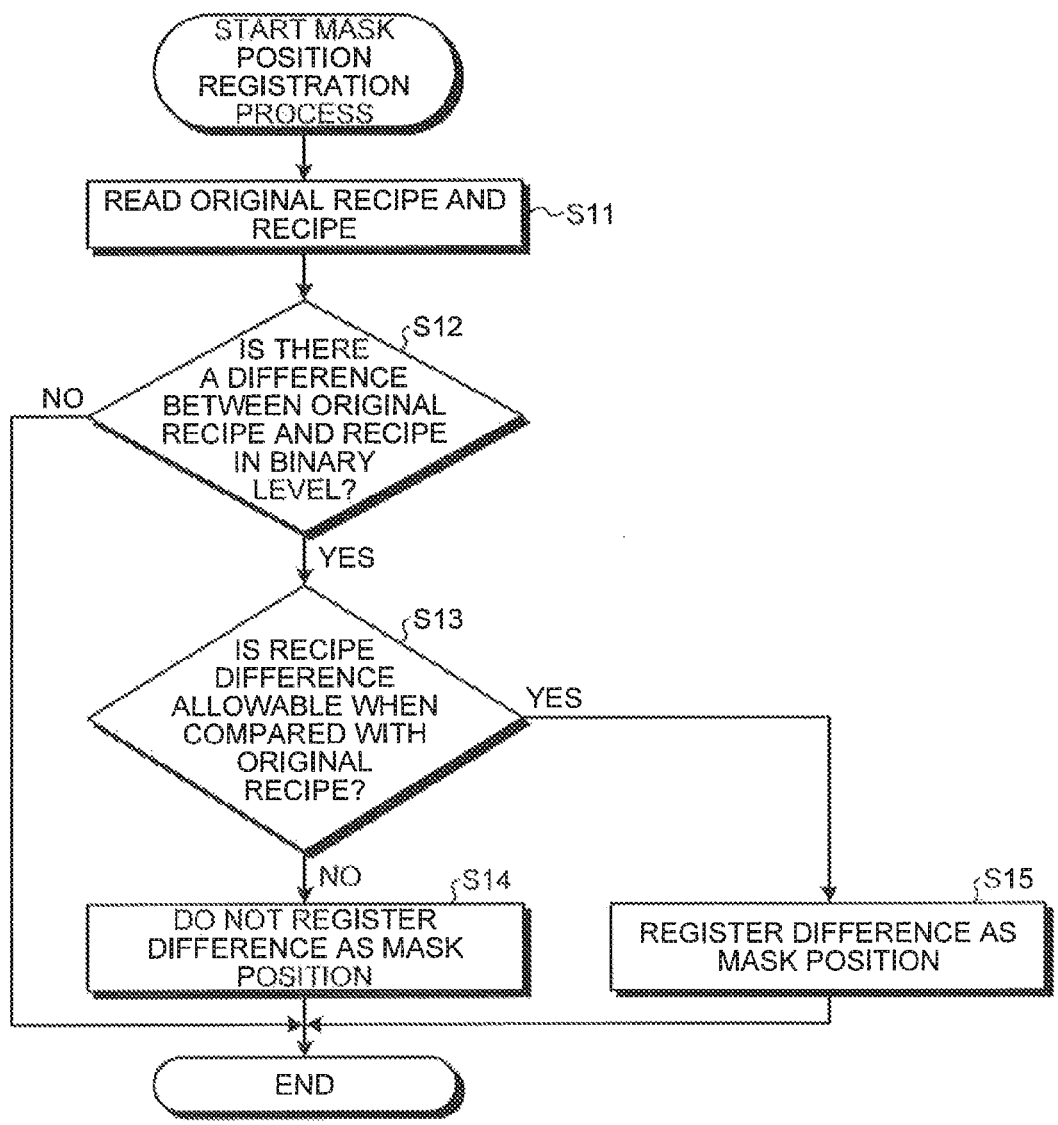
FIG. 5 is a flowchart illustrating an example of a procedure of a mask position registration process according to an embodiment.

FIG. 5 is a flowchart illustrating an example of a procedure of a mask position registration process according to an embodiment. First, the mask position registration unit 23 reads a binary-format original recipe and a comparison recipe (Step S11) and compares contents of the two recipes in a binary level to determine whether there is a difference there between (Step S12). In the case where there is no difference between the two recipes (No in Step S12), the mask position registration process is ended.

On the other hand, in the case where there is a difference between the two recipes (Yes in Step S12), a comparison process is performed between the contents of the original recipe and the comparison recipe to determine whether the recipe difference is allowable with respect to the original recipe (Step S13).

The determination process may be performed in various methods. For example, the original recipe and the recipe are converted into text-data-format original recipe and text-data-format recipe by a recipe editor, and the two recipes are compared to determine whether there is a difference in parameters about process items. At this time, with respect to each process item, a range of a value of a parameter is set in advance by using a value of the original recipe as a reference; and it may be determined whether a value of the text-format recipe is within the range to determine whether there is a difference.

In addition, in the case where a user recognizes a modified portion (modified content) of the recipe with respect to the original recipe, the user can determine whether the difference between the two recipes is allowable. For example, similarly to the case (1), in the case where the modified portion of the recipe is obtained by modifying a portion of the parameters of the original recipe only according to the apparatus characteristics, the user determines that the difference is allowable. In addition, similarly to the case (2), in the case where the modified portion of the recipe is obtained by modifying a portion of the parameters of the original recipe only through an experiment, the user determines that the difference is not allowable.

As a result of the determination, in the case where the value of the recipe is not allowable with respect to the original recipe (No in Step S13), the difference is not registered in mask position information of the mask position storage unit 22 (Step S14), and the mask position registration process is ended. In addition, in the case where the value of the recipe is allowable with respect to the original recipe (Yes in Step S13), the position where there is a difference of the recipe with respect to the original recipe is registered as a mask position in the mask position information of the mask position storage unit 22 (Step S15). At this time, the position where there is a difference may be registered in correspondence with the reason thereof. After that, the mask position registration process is ended.

FIGS. 6A to 6C are schematic diagrams illustrating aspects of registration of mask position information. For example, as illustrated in FIG. 6A, as a result of comparison of the original recipe 100A and the recipe 100X, there is a difference at a position R2 of the recipe 100X. In the case where the difference at the position P2 is allowable, the position R2 is registered in the mask position information. At this time, as illustrated in FIG. 6B, a reason thereof may be attached as a remark to the mask position R2. For example, a remark "Parameter 00 Modified According to Apparatus Characteristics" or the like may be attached corresponding to the mask position R2.

FIG. 6C is an example of a mask produced based on mask position information. In this example, a mask 111 is applied to a position R2 of binary data format 110. In this manner, an area where the mask 111 is applied is excluded as an area where comparison (determination) does not need to be performed.

In addition, in this manner, in comparison with a recipe where a plurality of parameters is modified during the mask position information registration, a recipe where only one parameter is modified is preferable used. This is because which position of the binary-format recipe corresponds to the modification of the parameter can be estimated.

<Recipe Comparison Process>

FIG. 7 is a flowchart illustrating an example of a procedure of a recipe comparison process according to an embodiment. First, the recipe reading unit 21 reads an original recipe and a recipe from a reference processing apparatus and a comparison target apparatus (Step S31). Next, the mask unit 24 reads mask position information from the mask position storage unit 22 (Step S32) and applies masks on the read original recipe and the read recipe (Step S33).

Next, the determination unit 25 compares the masked original recipe and the masked recipe in a binary level to determine whether the recipe has a difference with respect to the original recipe (Step S34). In this case, the masked portions are not compared.

In the case where the recipe has no difference with respect to the original recipe (No in Step S34), the determination unit 25 determines that the comparison recipe is not abnormal (Step S35), and the recipe comparison process is ended.

In the case where the recipe has a difference with respect to the original recipe (Yes in Step S34), the determination unit 25 determines that the comparison recipe is abnormal (Step S36). Next, the abnormality output unit 26 outputs a warning message indicating that the recipe is abnormal (Step S37). Accordingly, it is possible to prevent the user from forgetting to return the modified parameters in the recipe to the original values. After that, the recipe comparison process is ended.

Figure 8A:
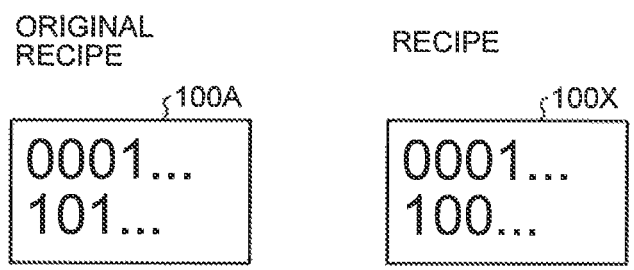
FIGS. 8A and 8B are schematic diagrams illustrating aspects of a procedure of a recipe comparison process.
Figure 8B:
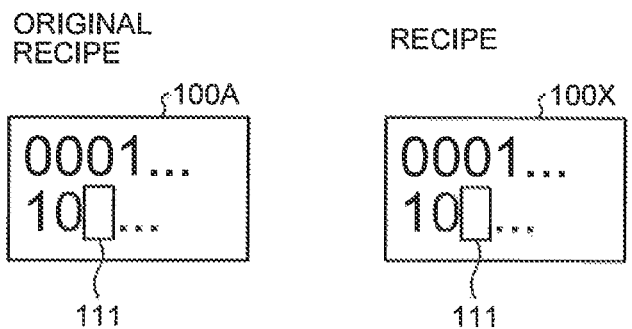

FIGS. 8A and 8B are schematic diagrams illustrating aspects of a procedure of a recipe comparison process. FIG. 8A illustrates a read original recipe 100A and a read comparison recipe 100X. If a mask ill is applied to the original recipe 100A and the recipe 100X based on the mask position information of the mask position storage unit 22, states illustrated in FIG. 8B are obtained. As illustrated in the figure, the mask 111 is applied to the portions where comparison is not desired. Next, the original recipe 100A and the recipe 100X are compared in the sates illustrated in FIG. 8B to determine whether the recipe 100X has a content which is basically matched with the original recipe 100A.

In addition, during the mask position registration process, the recipe comparison process is not performed; and during the recipe comparison process, the mask position registration process is not performed. Therefore, which one of the mask position registration process and the recipe comparison process is to be performed is determined, for example, by a changeover switch.

As described above, in the embodiment, the data position in the binary data where comparison is not performed is registered as a mask position in the mask position storage unit 22, and a mask 111 is applied to the mask positions of the read original recipe 100A and the read recipe 100X. Next, two pieces of data are compared in a binary level. Therefore, for example, in the case where a parameter of a processing apparatus is modified through an experiment but returning of the parameter to the original parameter is forgotten, there is an advantage in that it is possible to detect the forgetting to return the parameter. In addition, since comparison is not performed at the portion prescribed in the mask position, for example, in the case where a parameter of the recipe 100X as a copy of the original recipe 100A is modified according to the apparatus characteristics, the modification is considered to be a difference within an allowable range with respect to the original recipe 100A by the user, so that the modification is not detected. As a result, there is an advantage in that only a parameter of which a difference designated by the user is desired to be detected can be detected as an error.

In addition, in comparison with a general case where binary data is converted into text data and contents of the recipes are compared, since abnormal portions can be detected by directly performing comparison of the binary data, there is an advantage in that it is possible to rapidly perform abnormality detection. In addition, since comparison is performed by using binary-format data, in the case where a new-type processing apparatus is introduced in a semiconductor manufacturing system, a new algorithm for comparison is not necessary to be produced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A recipe management apparatus for comparing recipes prescribing process conditions of processing apparatuses between a plurality of the processing apparatuses having the same type, comprising:
 a recipe reading unit configured to read binary-format recipes of the plurality of processing apparatuses;
 a mask unit configured to apply masks to data of the recipes based on mask position information prescribing mask positions which are applied with the masks in binary-format data of the recipes; and
 a determination unit configured to compare a plurality of the recipes applied with the masks, and configured to determine whether there is a difference in which a mask position storage unit configured to store the mask position information; and a mask position registration unit configured to register the mask position information in the mask position storage unit, wherein the plurality of recipes include: an original recipe which is optimized with respect to a reference processing apparatus among the plurality of processing apparatuses; and recipe data which is produced by optimizing recipe data copied from the original recipe with respect to processing apparatuses other than the reference processing apparatus among the plurality of processing apparatuses, wherein the mask position registration unit compares the original recipe and the comparison recipe read by the recipe reading unit in a binary level, and in the case where a difference of the recipe with respect to the original recipe is allowable, the mask position registration unit registers the difference as mask position information, and in the case where the difference is not allowable, the mask position registration unit does not register the difference as mask position information.

2. The recipe management apparatus according to claim 1, further comprising an abnormality output unit configured output abnormality in a case where the determination unit determines that there is a difference.

3. The recipe management apparatus according to claim 1, wherein the mask position is a position where a difference between the plurality of recipes is allowable.

4. The recipe management apparatus according to claim 1, wherein the plurality of recipes include:
 an original recipe which is optimised with respect to a reference processing apparatus among the plurality of processing apparatuses; and
 recipe data which is produced by optimizing recipe data copied from the original recipe with respect to processing apparatuses other than the reference processing apparatus among the plurality of processing apparatuses.

5. The recipe management apparatus according to claim 4, wherein the mask position information includes a recording position of a parameter which is optimized according to characteristics of a processing apparatus other than the reference processing apparatus among differences between the original recipe and the recipe data which is optimized with respect to the processing apparatuses other than the reference processing apparatus.

6. The recipe management apparatus according to claim 1, wherein the recipe reading unit reads the recipe of the processing apparatus through a portable information storage medium or a network.

7. The recipe management apparatus according to claim 1, wherein the mask position information includes a mask position which is counted from lead data of the binary-format recipe.

8. The recipe management apparatus according to claim 7, wherein the mask position information further includes a remark corresponding to the mask position.

9. The recipe management apparatus according to claim 7, wherein the mask position includes a recording position of a date of updating of the binary-format recipe.

10. The recipe management apparatus according to claim 1, further comprising a changeover switch which changes processes, so that the mask position information registration process by a mask position registration unit and a recipe comparison process between the recipes by the determination unit are not to be simultaneously performed.

11. The recipe management apparatus according to claim 1, wherein the plurality of recipes have the same format.

12. A recipe management method of comparing recipes prescribing process conditions of processing apparatuses between a plurality of the processing apparatuses having the same type, comprising:
 reading binary-format recipes of the plurality of processing apparatuses;
 applying masks to data of the recipes based on mask position information prescribing mask positions which are applied with the masks in binary-format data of the recipes;
 comparing the plurality of recipes applied with the masks, and
 determining whether there is a difference between the plurality of recipes in which a mask position storage unit configured to store the mask position information; and a mask position registration unit configured to register the mask position information in the mask position storage unit, wherein the plurality of recipes include: an original recipe which is optimized with respect to a reference processing apparatus among the plurality of processing apparatuses; and recipe data which is produced by optimizing recipe data copied from the original recipe with respect to processing apparatuses other than the reference processing apparatus among the plurality of processing apparatuses, wherein the mask position registration unit compares the original recipe and the comparison recipe read by the recipe reading unit in a binary level, and in the case where a difference of the recipe with respect to the original recipe is allowable, the mask position registration unit registers the difference as mask position information, and in the case where the difference is not allowable, the mask position registration unit does not register the difference as mask position information.

13. The recipe management method according to claim 12, wherein in a determination, in a case where it is determined that there is a difference between the plurality of recipes, abnormality is output.

14. The recipe management method according to claim 12, wherein the mask position is a position where a difference between the plurality of recipes is allowable.

15. The recipe management method according to claim 12, wherein the plurality of recipes include:
 an original recipe which is optimized with respect to a reference processing apparatus among the plurality of processing apparatuses; and
 recipe data which is produced by optimizing recipe data copied from the original recipe with respect to processing apparatuses other than the reference processing apparatus among the plurality of processing apparatuses.

16. The recipe management method according to claim 12, wherein in the reading of the recipe, the recipe of the processing apparatus is read through a portable information storage medium or a network.

17. The recipe management method according to claim 12, wherein the mask position information includes a mask position which is counted from lead data of the binary-format recipe.

18. The recipe management method according to claim 17, wherein the mask position information further includes a remark corresponding to the mask position.

* * * * *